United States Patent [19]

Wycoff et al.

[11] 4,429,279

[45] Jan. 31, 1984

[54] VARIABLE BANDWIDTH FILTER

[75] Inventors: Keith H. Wycoff, 1205 N. Tyler St., Lexington, Nebr. 68850; William H. Dittmer, Mesa, Ariz.

[73] Assignee: Keith H. Wycoff, Lexington, Nebr.

[21] Appl. No.: 388,115

[22] Filed: Jun. 14, 1982

Related U.S. Application Data

[60] Division of Ser. No. 165,212, Jul. 1, 1980, which is a continuation-in-part of Ser. No. 84,460, Oct. 12, 1979, abandoned.

[51] Int. Cl.³ .............................................. H04B 1/10
[52] U.S. Cl. .................................. 328/139; 328/140; 455/266; 455/339; 455/340; 307/520
[58] Field of Search ............... 455/150, 266, 339, 340; 307/520; 328/139, 140, 138

[56] References Cited

U.S. PATENT DOCUMENTS

| | | | |
|---|---|---|---|
| 3,218,641 | 11/1965 | Maynard | 455/266 |
| 4,124,817 | 11/1978 | Takahashi | 455/266 |
| 4,158,148 | 6/1979 | Teller | 328/138 |
| 4,339,828 | 7/1982 | Chasek | 455/266 |

*Primary Examiner*—John S. Heyman
*Attorney, Agent, or Firm*—Dithmar, Stotland, Stratman & Levy

[57] ABSTRACT

The filter has a fixed Q and is coupled to a source of AC signals. A source of pulses is applied to a variable-voltage circuit, the circuit being responsive to each pulse to produce a threshold voltage which varies from a first value toward a second value. A comparator circuit has one input coupled to the filter and a second input coupled to the variable voltage circuit. The comparator produces a signal for a duration related to the time the amplitude of an AC signal from the filter is at least equal to the threshold voltage.

7 Claims, 3 Drawing Figures

VARIABLE BANDWIDTH FILTER

CROSS-REFERENCE TO RELATED APPLICATION

This application is a division of application Ser. No. 165,212, filed July 1, 1980, which in turn is a continuation-in-part of co-pending application Ser. No. 84,460, filed Oct. 12, 1979, now abandoned.

BACKGROUND OF THE INVENTION

A receiver intercepts signals and converts them into information for the listener. The information is transmitted in the form of modulation on an RF carrier wave. The receiver has a demodulator which removes the modulation components from the incoming signal. Circuitry then processes thes modulation components to provide useful information to the listener. There are situations where it is important to analyze the received signal as quickly as possible in order to evaluate whether the receiver is to process it further. In the past, the receiver included circuitry to look for the presence of the desired signal and when it was determined that it was indeed present, the receiver would be placed in condition for further processing of the signal. On the other hand, if the desired signal was not detected, it would not be further processed. This procedure of searching for the presence of the desired signal consumed too much time.

Two examples of receivers in which the search for the presence of a specific signal consumed too much time are those with battery saving and those that scan several channels.

The first type of receiver is portable and, therefore, incorporates batteries as the source of power. Throw-away batteries are less expensive and more convenient than rechargeable batteries which must be constantly recharged. However, throw-away batteries need to be replaced more often than rechargeable batteries. It has been proposed to increase the useful life and thereby improve the convenience of throw-away batteries by reducing the power consumed by the receiver. Battery-saver circuits deliver pulsed power to the various circuits in the receiver until a message for that receiver is received, at which time the power becomes continuous. Since it is during the pulses that the receiver is consuming power, it is desirable to minimize the pulse duration. However, each pulse must be long enough to insure that the signal will be detected and cause the battery saver circuit to provide continuous power.

Prior art detectors have not operated fast enough, particularly when the signal-to-noise ratio is poor. Also, the relatively slow speed of operation of prior art detectors which searched for signal presence necessitated excessively long battery-saver pulses. The basic problem with these prior art receivers is that they were pulsed on for a predetermined (fixed) time period.

Such battery-saver circuits may be employed in either a carrier-squelch receiver or in a selective call receiver. A carrier-squelch receiver is normally disabled so as not to reproduce noise or communications on the channel. Presence of a carrier wave, as indicated by the absence of noise from the demodulator, unsquelches the receiver. Such a receiver may have a battery saver circuit which produces pulsed power. In the presence of the carrier wave, the supply voltage becomes continuous. In order not to lose communications on the channel, it is desirable that the receiver rapidly respond when the carrier wave signal is present so that the battery saver pulses can be as narrow as possible. Because these prior art carrier-squelch receivers searched for the presence of the carrier wave (usually by detecting loss of noise from the demodulator), the battery-saver pulses were unnecessarily long thereby increasing power consumption by the receiver.

Such battery-saver circuits may also be employed in a selective-call receiver. A selective call communication system comprises a transmitter and a number of such receivers. Each receiver is designed to intercept the same carrier wave, but its alerting circuitry is rendered operative only when the carrier wave is modulated by a predetermined code. Upon reception of such code, the receiver produces an audible or visible alerting signal. In certain kinds of systems, the signal is followed immediately by a voice message. In others, no voice message is transmitted. The possessor of the latter type, upon being alerted, will perform some previously agreed upon action such as calling his office. A selective-call receiver incorporates a code detector. Prior art detector circuits looked for the presence of a particular code. The code used to signal the receiver could be binary in nature or a tone signal. A tone signal code consists of a single tone, two or more simultaneous tones, or a tone sequence. In the case of a tone sequence, the detector maintains the supply voltage to the processor circuit continuous upon valid detection of the presence of the first tone. When the frequency of the tone perfectly matches the center frequency of the filter in the detector and the incoming signal is strong, detection takes place rapidly. The detector can produce an output very quickly to cause the battery-saver circuit to provide a continuous supply voltage, thereby keeping the processor circuit operative.

In prior art receivers the fact that detection of the signal is fast under such circumstances serves no useful benefit. This is because the processor circuit is operative for the duration of each battery saver pulse anyway, so that weak signals can be detected. When the receiver is far from the transmitter and is receiving a noisy carrier modulated with tone, the signal-to-noise (S/N) ratio is poorer, causing tone detection time to increase greatly. Thus, whether the detector detects the tone rapidly or not, the on period of the processor circuit must be long enough to detect the tone under all usable conditions.

Current is, of course, consumed for the duration of each pulse. The prior art receiver remains on and draws current for the entirety of each battery saver pulse, because it has been designed to hold the receiver on for detection of signal presence.

As mentioned above, the time for detection is also important in scanning receivers. In a scanning receiver, a local oscillator produces a locally generated signal which is applied at one input to a mixer, the other input of which is the incoming or RF signal. The mixer output, called a "high IF signal", has components at a frequency equal to the difference in the frequencies of the locally generated signal and the carrier wave. A low IF signal is generated by mixing the high IF signal with a second locally generated signal.

Channel selection is usually made by adjusting the frequency of the first locally generated signal. In a scanning receiver, variation in the frequency of the first locally generated signal is effected automatically. Detection of the presence of a carrier wave in the corresponding channel will lock the local oscillator onto the frequency at which it is then set, so that the carrier wave can be demodulated. This usually is accomplished by analyzing the output of the demodulator. If the noise content of such output exceeds a certain level, then the carrier wave on that particular channel is not present. If the noise is less than such level, a communication is taking place on the channel. In the past, scanning receivers had detectors that searched for the presence of the carrier wave. The longer it takes the detector to make its analysis, the longer the receiver must be tuned to each channel in order that it can be certain whether a communication is taking place on each channel.

When the incoming signal is strong, detection takes place rapidly. The detector can produce an output very quickly to cause the processor circuit to remain tuned to the channel then being scanned. However, the receiver may be a long distance from the transmitter so that the signal applied to the detector is mixed with noise; i.e. the signal is weak and the S/N ratio is poor. A poor S/N ratio causes the detection time to increase greatly. Thus, the detector responds rapidly in ideal situations but slowly when the S/N ratio is poor. Prior art scanning receivers had to be tuned to each channel for a predetermined (fixed) period of time long enough to enable the processor circuit to detect the presence of carrier under the worst S/N conditions.

As a result, fewer channels could be scanned in a given period of time.

Scanning receivers have been employed in selective-call communication systems. Each receiver in such a system is designed to intercept an RF signal with a carrier-wave frequency in one of a plurality of channels, but its alerting circuitry is rendered operative only when the carrier wave is modulated by a predetermined code. Upon reception of such code, the receiver produces an audible or visible alerting signal, as above described. Here, too, some past scanning receivers employed signal detectors which looked for the presence of the code. As a result, the receiver was required to scan each channel for a longer time in order that it could be certain whether a carrier wave on that channel was modulated by the code. The time on each channel could be no less than that required to detect the code's presence under the worst S/N ratio conditions.

Another reason that selective call scanning receivers in the past have not responded rapidly enough is because the filter(s) in the decoder retained some energy after analysis of the processed signal had been made. If that energy is not dissipated, the amplitude of the filter output will effectively be reduced by the energy left in the filter if the processor signal is not precisely in phase with the oscillations occurring in the filter by reason of such energy. Energy left in the filter, therefore, will lengthen the time the receiver must be set to a given channel, to insure detection.

A selective-call scanning receiver can incorporate battery saving. It is only during each pulse of power that the receiver is operative to scan all of the channels. The shorter the pulse duration, the less time the receiver will be set at a given channel. In a scanning receiver, therefore, it is doubly important that the detection time be as short as possible.

Filters used in selective-call receivers often include capacitors and inductors connected in series-resonant or parallel resonant circuits. However, inductors are expensive and generally not compatible with integrated circuits. Active filters have been used in the past to simulate inductors, but a filter of this type is a substantial drain on the battery.

SUMMARY OF THE INVENTION

An important object is to provide a signal detector which initially has a relatively wide bandwidth so as to respond rapidly to AC signals applied thereto, but which bandwidth is decreased so that an AC signal to which the receiver is not designed to respond will not cause an alerting tone to be generated and/or to unsquelch the receiver.

In summary, there is provided a signal detector for a signal receiver having means for supplying AC signals, the detector comprising a frequency sensor having an output and first and second inputs, the first input being coupled to the AC signal supplying means, the frequency sensor being operative to produce an output signal on the output in response to an AC signal having a frequency within a variable bandwidth, and a source of initializing voltages independent of the AC signal supplying means and coupled to the second input, the frequency sensor having means for causing the bandwidth to be relatively wide upon application of each initializing voltage and to decrease thereafter.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the invention.

BRIEF DESCRIPTION OF THE DRAWINGS

For the purpose of facilitating an understanding of the invention, there is illustrated in the accompanying drawings, preferred embodiments thereof, from an inspection of which, when considered in connection with the following description, the invention, its construction, and operation, and many of its advantages should be readily understood and appreciated.

DESCRIPTION OF THE PREFERRED EMBODIMENTS

Figure 1:
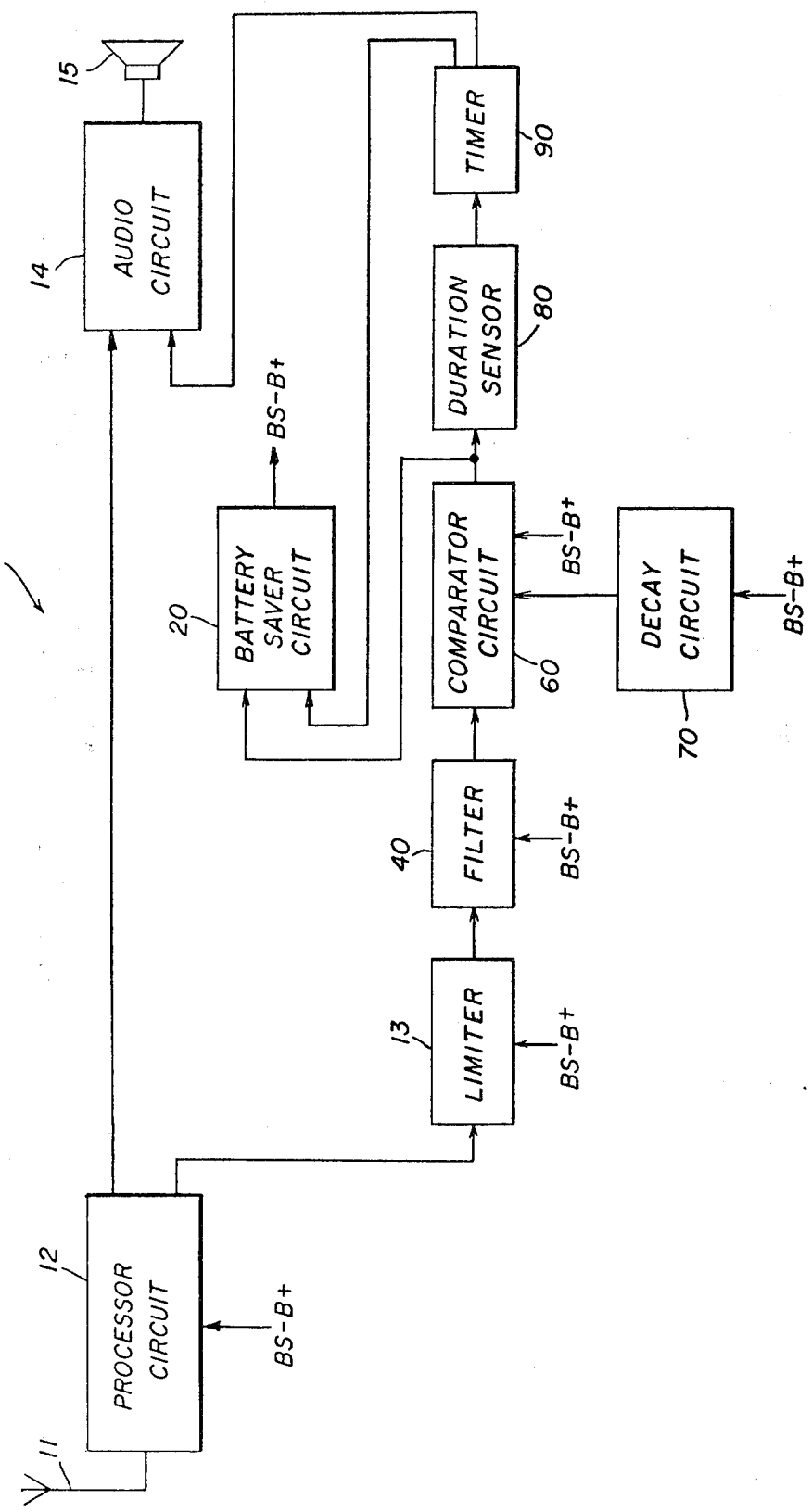
FIG. 1 is a block diagram of a single-tone, selective-call receiver having a signal absence detector incorporating the features of the present invention.

Referring now to FIG. 1, there is shown a communication receiver 10 made in accordance with and embodying the principles of the present invention. The receiver 10 is basically selective call in nature, meaning that it is generally squelched or inoperative, and becomes unsquelched to enable communication if it receives a predetermined code consisting of a single tone. This particular receiver is of the tone-and-voice type. The code to which the receiver is designed to respond will unsquelch it and cause it to produce an alerting tone. In addition, the tone will cause the receiver to be enabled for some additional period of time in order to reproduce an audio message sent by the transmitter.

The receiver 10 is adapted to receive an incoming signal consisting of an RF carrier wave modulated by the code, followed by an audio message. The transmissions are intercepted by an antenna 11 and are conveyed to a processor circuit 12 which includes the usual local oscillator(s), mixer(s) and demodulator. The demodulator furnishes the code followed by an audio message. The code portion is applied to a limiter 13 which increases the amplitude of the code to a fixed value. An audio circuit 14 amplifies the rest of the code tone and the ensuing audio signals from the processor circuit 12. A loudspeaker 15 converts the alerting tone and the audio signal into sound waves. Normally, the receiver is squelched; in other words, the audio circuit 14 is disabled so that audio signals, noise and all other communications on the channel cannot be heard. In the presence of a proper code, the audio circuit 14 becomes enabled so that it can amplify the alerting tone and the audio signal and apply same to the loudspeaker 15.

An important aspect of the present invention is the reduction in drain on the batteries which the receiver 10 uses. There is provided a battery-saver circuit 20 which provides a pulsed supply voltage shown as "BS-B+". Periodically, say every 1.75 seconds, the supply voltage is present for an extremely short period of time, say 1 or 2 milliseconds (ms.). During these 2 ms. intervals, the receiver 10 is consuming power, and during the time between pulses, virtually no power is being drained from the battery. Hereafter, wherever 2 ms. intervals are referred to, it should be understood that shorter periods will be useful as well. The processor circuit 12, the limiter 13, and other circuits are supplied with the BS-B+ supply voltage. During the proper code, the battery-saver circuit 20 is caused to produce a continuous supply voltage.

As explained, the code from the limiter 13 will be a single tone which is converted to a sequence of square waves at the frequency of the tone, which is applied to an active filter 40. The filter 40 is responsive to a train of tone pulses at a predetermined frequency to provide a sinusoidal output wave. The filter 40 is supplied by the BS-B+ supply voltage, so that it uses negligible power during standby. The receiver 10 further includes a comparator circuit 60 having its signal input coupled to the output of the filter 40 and a reference input coupled to a decay circuit 70. When the voltage on the signal input equals or exceeds the voltage on the reference input, the comparator circuit 60 produces a comparator signal.

The pulsating supply voltage BS-B+ is applied to the decay circuit 70. As explained previously, the BS-B+ supply voltage consists of a series of pulses. The decay circuit 70 is responsive to each such pulse to produce a threshold voltage which decays from a first value to a second value. The reference input of the comparator circuit 60 is coupled to the decay circuit 70. When the amplitude of the signal from the filter 40 is at least equal to the threshold voltage, the comparator circuit 60 produces a comparator signal. As soon as the amplitude of the signal from the filter 40 decreases so that it no longer crosses the threshold, the comparator signal ends. Thus, the comparator signal has a duration corresponding to the time that the signal from the filter 40 is equal to or greater than the threshold voltage.

The bias voltages in the filter 40 are established such that a signal which passes therethrough will have an amplitude substantially equal to the initial value of the threshold voltage from the decay circuit 70. However, the threshold immediately begins to decay so that signals from the filter 40 may or may not have an amplitude exceeding the threshold at a later time during each pulse. Accordingly, any signals having frequency components within the bandwidth of the filter 40 and passing therethrough will necessarily have an initial amplitude sufficient to be equal to the threshold and cause the inception of a comparator signal from the comparator circuit 60. In the case of noise developed in the processor circuit 12 and having frequency components within the bandwidth of the filter 40, a signal will be applied to the signal input of the comparator circuit 60, having an initial amplitude at least equal to the threshold voltage. However, the noise components cause the filter output to have a relatively low amplitude so that the decaying threshold voltage will cause the comparator signal to terminate rather quickly, within a few milliseconds or so. Thus, in the case of noise, a comparator signal will be produced by the comparator circuit 60 but of relatively short duration.

A tone having a frequency in a channel adjacent to the channel established by the center frequency of the filter 40 may initially be within the bandwidth of such filter. Thus, at the outset, the filter output signal will cross the threshold the same as the correct tone, thereby producing a comparator signal. However, the peaks of such filter input signal soon discontinues crossing the threshold, thereby causing the comparator signal to cease, indicating absence detection.

If the signal received by the processor circuit 12 includes the tone to which the filter 40 is designed to respond, a relatively high amplitude signal will be applied to the signal input of the comparator circuit 60, which has an amplitude equal to the threshold voltage from the decay circuit 70, thereby commencing a comparator signal. The peaks of the signal from the filter 40, being of relatively high amplitude, continue to exceed the threshold voltage even though the threshold voltage is decaying. The comparator signal continues for a period of time substantially equal to the duration of that part of the tone that is actually detected.

The maximum and minimum values of the threshold voltage and the rate of decay thereof must be carefully selected. The shallower the threshold voltage curve, the more susceptible the receiver 10 would be to falsing in the presence of adjacent-channel tones and noise. Also, the slower the rate of decay of the threshold voltage curve, the greater the current the receiver will draw in response to extraneous signals. Thus, it is desirable to maximize the slope to minimize the time during which current is drawn from the battery. One limiting factor in this regard is the desired signal-to-noise response. If the slope is too great, then low level signals which are likely to be mixed with substantial noise, will not be detected because their negative peaks will not continously exceed the decaying threshold.

If the time between battery saver pulses is 1.75 seconds, the duration of the comparator signal from the comparator circuit 60 would have a duration up to 1.75 seconds shorther than the tone, depending upon the extent of coincidence between the start of the tone and the occurrence of a battery saver pulse. If they happened to be in coincidence, then the comparator signal would have a duration substantially the same as the duration of the tone. Much more likely, however, is that the tone will start at some time between battery saver pulses, in which case, the comparator signal will have a duration less than the code tone. For example, if the code tone has a duration of 2.5 seconds, the comparator signal could be as long as 2.5 seconds if the inception of the code tone took place simultaneously with the battery saver pulse. The comparator signal could be as short as about 750 ms. if the code tone immediately followed a battery saver pulse, assuming 1.75 seconds between battery saver pulses.

The comparator signal will have a long duration of between 750 ms. and 2.5 seconds in the presence of a code tone to which the filter 40 is designed to respond and a duration of just a few milliseconds if the receiver 10 is receiving an adjacent-channel code tone or if the receiver output is noise.

The comparator signal is applied to a duration sensor 80. If the comparator signal has a duration greater than a predetermined value, such as 600 ms., an output signal will be produced and applied to a timer 90. The timer 90 produces timer signals commencing with the output signal from the duration sensor 80 and terminating a predetermined time later, such as 10 seconds. The timer 90 is coupled to the audio circuit 14. One timer signal enables the audio circuit 14 so that it can transmit the balance of the code tone which would be between 150 ms. and 1.9 seconds in duration (assuming a code tone 2.5 seconds in duration, a space between pulses of 1.75 seconds, and a duration sensor 80 requiring 600 ms. to produce an output signal). The tone applied to the audio circuit 14 is reproduced by the loudspeaker 15 to create an alerting tone informing the bearer of the receiver 10 of an audio message to follow. The audio circuit 14 is in fact enabled for an additional 10-second period of time so that the audio message which follows the code tone will be processed, amplified and reproduced by the loudspeaker 15. Alternatively, the alerting tone can be internally generated.

The battery saver circuit 20 normally produces a pulsating signal as previously explained. The output of the comparator circuit 60 is coupled not only to the duration sensor 80 but also to the battery saver circuit 20. Thus, in the presence of the comparator signal, the BS-B+ supply voltage becomes continuous. As explained previously, the comparator signal commences almost instantaneously with the inception of a limited processed signal from the limiter 13. This signal may not be the proper code tone but instead may be certain noise components or adjacent-channel code tones. As soon as such extraneous components passing through the filter 40 drop below the threshold, the battery saver circuit 20 reverts to producing a pulsating supply voltage. In other words, the comparator circuit 60 commences producing a comparator signal substantially instantaneously, which causes the supply voltage to become continuous. The supply voltage remains continuous until the output of the filter 40 drops below the threshold level, signifying determination that the tone is in fact absent. In the presence of the proper code tone, however, the comparator signal will last for a time between 750 ms. and 2.5 seconds and the supply voltage will be continuous for that period of time enabling the processor circuit 12 to continue to process the code tone.

The second timer signal from the timer 90, which commences in response to the proper code tone, is coupled to the battery saver circuit 20, to cause the supply voltage to be continuous for the duration of such timer signal, whereby the processor circuit 12 is continuously operative to process the intelligence message.

An important aspect of the present invention is that the battery saver circuit 20 produces pulses as narrow as possible in order to minimize power consumption. Because the receiver 10 once turned on will stay on until it is determined that the proper code tone is absent, those pulses can be extremely narrow, just a few milliseconds. However, with noise and adjacent-channel code tones, it is desirable that the battery saver circuit 20 be caused to revert to producing a pulsating supply voltage fairly quickly in order to minimize battery drain.

It is advantageous that the pulse from the battery-saver circuit 20 be as short as possible to improve battery life. The limiting factor in this embodiment is the time needed for the processor circuit 12 to respond to an incoming signal and provide a processed signal consisting of the modulation components. That time should be between a few microseconds and several hundred microseconds.

Basically, the filter 40, the comparator circuit 60 and the decay circuit 70 may be viewed as a signal absence detector which responds to any processed signal that has been driven to limiting by the limiter 13 to commence production of a comparator signal that extends the duration of the supply voltage from the battery-saver circuit 20. The processed signal may include noise and/or adjacent channel tones. Nevertheless, since, as far as the signal absence detector is concerned, the processed signal may include the desired tone, the supply voltage is caused to be continuous to maintain the processor circuit 12 operative in order to continue to process the incoming signal. If the proper tone is indeed present, the amplitude of the signal from the filter 40 will continue to exceed the threshold from the decay circuit 70 and the supply voltage will remain continuous. On the other hand, if the tone is not presence, the fact that it is absent will be determined when the level of the processed signal drops below the threshold, at which time the comparator signal terminates and the supply voltage is interrupted. Because the absence detector causes the battery-saver circuit 20 initially to produce a continuous supply voltage in the presence of any signal, and that signal will cause the supply voltage to remain continuous for some time, the pulse duration of the battery-saver pulses can be extremely narrow. Battery-saver circuits in receivers on the market today have been able to produce pulses a minimum of 30 ms. in duration and normally much longer. However, pulses produced by the battery-saver circuit 20 may be on the order of 0.5 ms. or less depending upon other factors to be discussed. Often detection of the absence of a tone could take place in 2 ms. or less, giving rise to a battery drain one tenth that which has been available. It can be appreciated that very substantial improvement in battery life may be achieved with so short a pulse duration.

Such reduction in the pulse width has been achieved without adverse effect on the sensitivity of the receiver 10. If the tone frequency received is far from the center frequency of the filter 40 and/or there is no incoming signal of the proper carrier-wave frequency at the antenna 11 absence detection takes place rapidly. The comparator circuit 60 output discontinues very quickly to cause the battery-saver circuit 20 to revert to producing a pulsating supply voltage. However, if the frequency of the tone is on the center frequency of the filter 40, even if the receiver is a long distance from the transmitter so that the processed signal applied to the detector is mixed with noise; i.e. the signal-to-noise (S/N) ratio is poor, the battery-saver circuit 20 will provide a continuous supply voltage. As long as the signal received exceeds the design S/N ratio, on average, the signal is or may be present. Below that level, absence detection will take place.

The filter 40, the comparator circuit 60, the decay circuit 70 and the duration sensor 80 may be considered to be a frequency sensor having a given bandwidth, which is an example of one type of signal absence detector that may be employed. All AC signals within that bandwidth will cause the frequency sensor to produce an output. At the start of each pulse, the bandwidth is relatively wide, so that not only will the correct code tone cause an output, but also noise and adjacent channels will cause the supply voltage to become continuous. However, the bandwidth of the frequency sensor narrows during the course of each such pulse so that only the proper code tone causes the audio circuit 14 to remain operative. Such variable bandwidth is achieved in one embodiment by utilizing a filter 40 with a fixed Q and changing the threshold applied to the comparator circuit 60 and filter 40. Another way of achieving such a variable bandwidth is to vary the Q of the filter 40. Initially the Q would be low so that the bandwidth would be wide. With time during each pulse, the Q of the filter would increase causing the bandwidth to be narrow. Alternately, a digital circuit which statistically detects the presence of a desired frequency may be used. This statistical detection circuit may be designed so that its detection bandwidth varies with time.

Although FIG. 1 depicts a selective-cell receiver, similar principles can be used in circuitry of a carrier-squelch receiver. In such receivers, the power is pulsed to the various circuits to minimize power consumption. In the presence of the carrier wave, that is, in the absence of noise, the battery saver circuit is caused to provide a continuous supply voltage. The battery saver pulses must be wide enough to render the processor circuit operative for a sufficiently long time to make the receiver function. In order to reduce the width of these pulses, the principles of the present invention can be employed in the carrier-detection circuit. Specifically, a squelch detector is coupled to the processor circuit 12, which responds to the presence of carrier (usually determined by loss of noise), to provide an unsquelch signal. The absence detector is responsive to absence of carrier or commencement of the squelch signal to provide a control signal. As long as it is determined that the carrier may be present, the unsquelch signal will continue to exist and the processor circuit will remain operative. As soon as it is determined that the incoming signal does not include the carrier wave to which the receiver is designed to respond, absence of such signal will have been detected and the unsquelch signal will terminate as will the supply voltage. The absence detector in such instance if directly detecting carrier may have a wide bandwidth response characteristic so that it responds rapidly to noise or even adjacent RF signals. However, the bandwidth immediately begins to narrow so that operation will continue only upon reception of the RF signal to which the receiver is designed to respond (or vice versa if measuring noise to determine carrier absence.)

To understand fully this invention, the meaning of the terms "presence detection" and "absence detection" must be understood. The signal is present when its signal-to-noise ratio exceeds a preset standard at a specific time. The signal is absent when its signal-to-noise ratio is less than that standard. Failing to detect the presence of signal is not the same as detecting its absence. Neither is failing to detect the absence of a signal the same as detecting its presence. There is a range between these two where noise prevents a positive detection. When the signal falls in such in between range, it is said that the signal "may be" present or "may be" absent.

Figure 2:
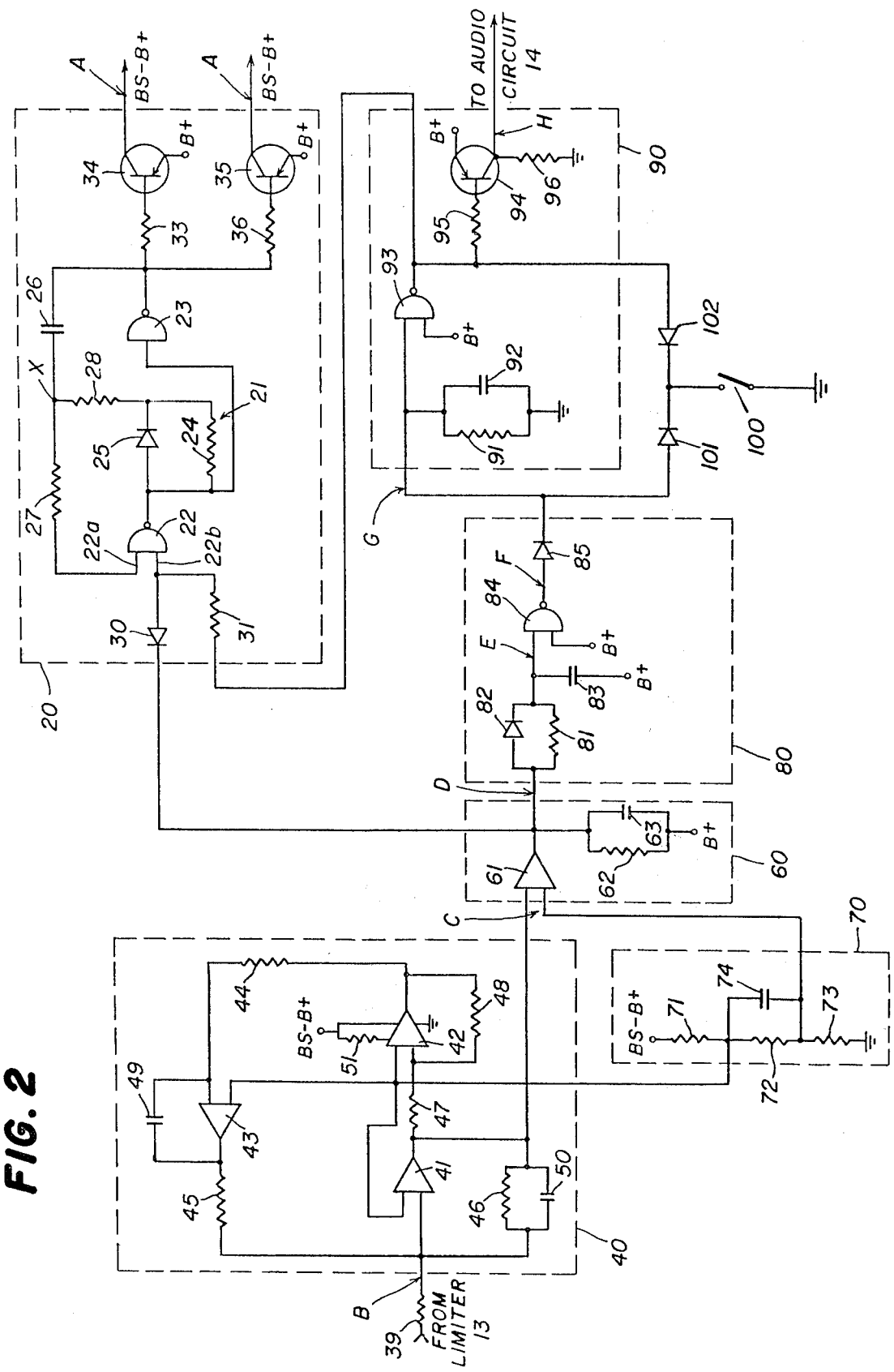
FIG. 2 is a schematic diagram of parts of the receiver of FIG. 1.

Turning now to FIG. 2, further details of the receiver 10 will be described.

The comparator circuit 60 includes a voltage comparator 61 having a signal input coupled to the output of the filter 40 and a reference input coupled to the junction of the resistors 72 and 73. Although not shown in FIG. 2, the comparator 61 is supplied by the pulsating supply voltage. The comparator circuit 60 also includes a circuit defined by a resistor 62 and a capacitor 63 connected in parallel between the output of the comparator 61 and the B+ supply voltage, which circuit serves to smooth the comparator signal produced by the comparator 61. When the amplitude of the sinusoidal wave from the filter 40 equals or exceeds the threshold voltage applied to the reference input of the comparator 61, its output essentially becomes low and the capacitor 63 charges immediately. The signal on the signal input is an AC signal, so that the comparator 61 will alternatively be turned on and off. The capacitor 63 will alternately charge rapidly and discharge slowly through the resistor 62. Thus, the comparator signal on the output of the comparator 61 is generally low but fluctuates.

The threshold voltage varies. At the inception of a pulse, there is no voltage drop across the resistor 72 by virtue of the capacitor 74. Accordingly, the voltage at the junction of the resistors 72 and 73 is the B+ supply voltage multiplied by the fraction represented by the value of the resistor 73 divided by the sum of the resistors 71 and 73. The capacitor 74 charges during the pulse so that the voltage at the junction of the resistors 72 and 73 decays at a rate determined by the components in the decay circuit 70, ultimately reaching a value equal to the B+ supply voltage multiplied by the fraction represented by the value of the resistor 73 divided by the sum of the values of the resistors 71, 72 and 73. In an operative form of this invention, the resistor 71 had a value of 100K, the resistor 72 had a value of 18K and the resistor 73 had a value of 82K; whereby at the start of each battery saver pulse, the voltage at the junction of the resistors 72 and 73 was 0.45 B+ (82/100+82). When the capacitor 74 is completely charged, the voltage at that point would be 0.41 B+ (82/100+18+82). Because the voltages at the junction of the resistors 72 and 73 and at the junction of the resistors 71 and 72 are initially the same, the signal from the filter 40 would have the same amplitude as the threshold supplied to the reference input of the comparator 61, thereby causing a comparator signal to start. In the presence of the code tone having a frequency to which the filter 40 is designed to respond, the amplitude of the signal out of the filter 40 will continue to exceed this threshold voltage even though it is falling. Actually, during each pulse, the signal at the signal input of the comparator 61 is fluctuating about a level that increases exponentially, because the op amp bias voltage at the junction of the resistors 71 and 72 is increasing, to say B+/2 (the values of the resistors 72 and 73 times B+, divided by the sum of the values of the resistors 71, 72 and 73).

However, if the signal from the limiter 13 is noise having components at the frequency of the filter 40, some sinusoidal wave components may be applied to the signal input of the comparator 61 which initially will be equal to the threshold thereat so that a comparator signal continues. However, the level of those components will be less than the threshold voltage which is decaying. When the amplitude of the signals from the filter 40 decreases so that its peaks no longer cross the threshold voltage, the comparator signal terminates. Similarly, an adjacent-channel code tone may cause an output from the filter 40, but the comparator signal will be short-lived since the amplitude of signals from the filter 40 would very quickly fall below the threshold voltage (i.e., peaks would no longer cross the threshold).

The comparator signal is applied to the diode 30 to cause the battery saver circuit 20 to discontinue producing a pulsed supply voltage and instead to produce a continuous voltage as previously explained.

As described above, the bias voltages for the op amps in the filter 40 are supplied by the decay circuit 70 so they increase during each battery saver pulse. This rise in voltage simply increases the effective variation of the threshold voltage with time since it is opposite in direction to the decaying threshold. A fixed voltage of $B+/2$ would be satisfactory, in which case it would be necessary to readjust the decaying threshold curve. To save parts, however, the varying $B+/2$ voltage from the decay circuit 70 is used. Since the decaying characteristic of the bias voltages is not a requirement, the connection between the circuit 70 and the filter 40 is not shown in FIG. 1.

The comparator signal is also applied to the duration sensor 80 which includes a timing circuit defined by a resistor 81 connected in parallel with a diode 82, and a capacitor 83 connected to the $B+$ supply voltage. The duration sensor 80 further includes an electronic switch 84 in the form of a NAND gate. A diode 85 connects the output of the electronic switch to the timer 90.

The output of the electronic switch 84 is normally low. When the input thereto drops below a predetermined switching value, say $B+/2$, the output becomes high. Upon the commencement of a comparator signal, that is, when the output of the comparator 61 becomes low, the capacitor 83 charges slowly through the resistor 81. The time constant represented by the values of the resistor 81 and capacitor 83 is such that the input to the electronic switch 84 will reach the switching value about 600 ms. after the commencement of the comparator signal. The figure 600 ms. is exemplary and the time constant can be established for any duration desired. Thus, an output signal would be created if the comparator signal has a duration of 600 ms. or longer. If the comparator signal terminates before that time, that is, the output of the comparator 61 becomes high, the input to the electronic switch 84 becomes high very quickly because the capacitor 83 discharges through the diode 82.

The timer 90 includes a timing network having a resistor 91 and a capacitor 92 connected in parallel between ground and the input of an electronic switch 93 in the form of a NAND gate. The electronic switch 93 is designed to switch and its output to become low when the signal on the signal input reaches a switching level of say, $B+/2$. Upon commencement of the output signal from the duration sensor 80, the capacitor 92 is substantially instantaneously charged to $B+$, thereby exceeding $B+/2$ and switching the electronic switch 93. When the output signal terminates, the capacitor 92 discharges through the resistor 91 at a very slow rate. Ultimately, the value on the signal input of the electronic switch 93 will fall below the switching voltage and the signal on the output thereof again becomes low. The values of the resistor 91 and the capacitor 92 are selected such that the output of the electronic switch 93 remains high for an extended period of time, say 10 seconds. The output of the electronic switch 93 is coupled to a PNP transistor 94 by way of resistor 95, the collector of which is connected to the audio circuit 14 and through a resistor 96 to ground. Thus, in the presence of the proper code tone, there will appear on the output of the timer 90, a timer signal which persists for an extended period of time, 10 seconds, for example, which maintains the audio circuit 14 operative for that period of time to translate the ensuing voice message.

A second timer signal also appears on the output of the electronic switch 93, which timer signal is of opposite polarity and is coupled to the battery saver circuit 20 via the resistor 31 therein. The low voltage on the output of the electronic switch 93 causes the battery saver circuit 20 to stop pulsing and instead provide a continuous supply voltage to the processor circuit 12, etc.

There is also provided a manually operated switch 100 coupled to the junction of diodes 101 and 102. The diode 101 is connected to the input to the timer 90 while the diode 102 is connected to the resistor 95 and also to the resistor 31 in the battery saver circuit 20. If the switch 100 is actuated, the capacitor 92 is rapidly discharged and the timer signal is terminated. At the same time, an enabling voltage is coupled through the diode 102 to the battery saver circuit 20 to maintain the supply voltage continuous as long as the switch 100 is actuated. Also, the enabling voltage is coupled through the resistor 95 to the transistor 94 so that the audio circuit 14 is maintained enabled as long as the switch 100 is actuated. Thus, operation of the switch 100 accomplishes two purposes: first, if the audio message was shorter than the duration of the timing signal, say 10 seconds, the switch 100 can be operated and released to resquelch the receiver before the end of the 10-second period. It also enables one to monitor the channel even though the proper code has not been received. The switch 100 also enables one to maintain the receiver 10 operative to process audio information even after the 10-second period has ended.

Figure 3:
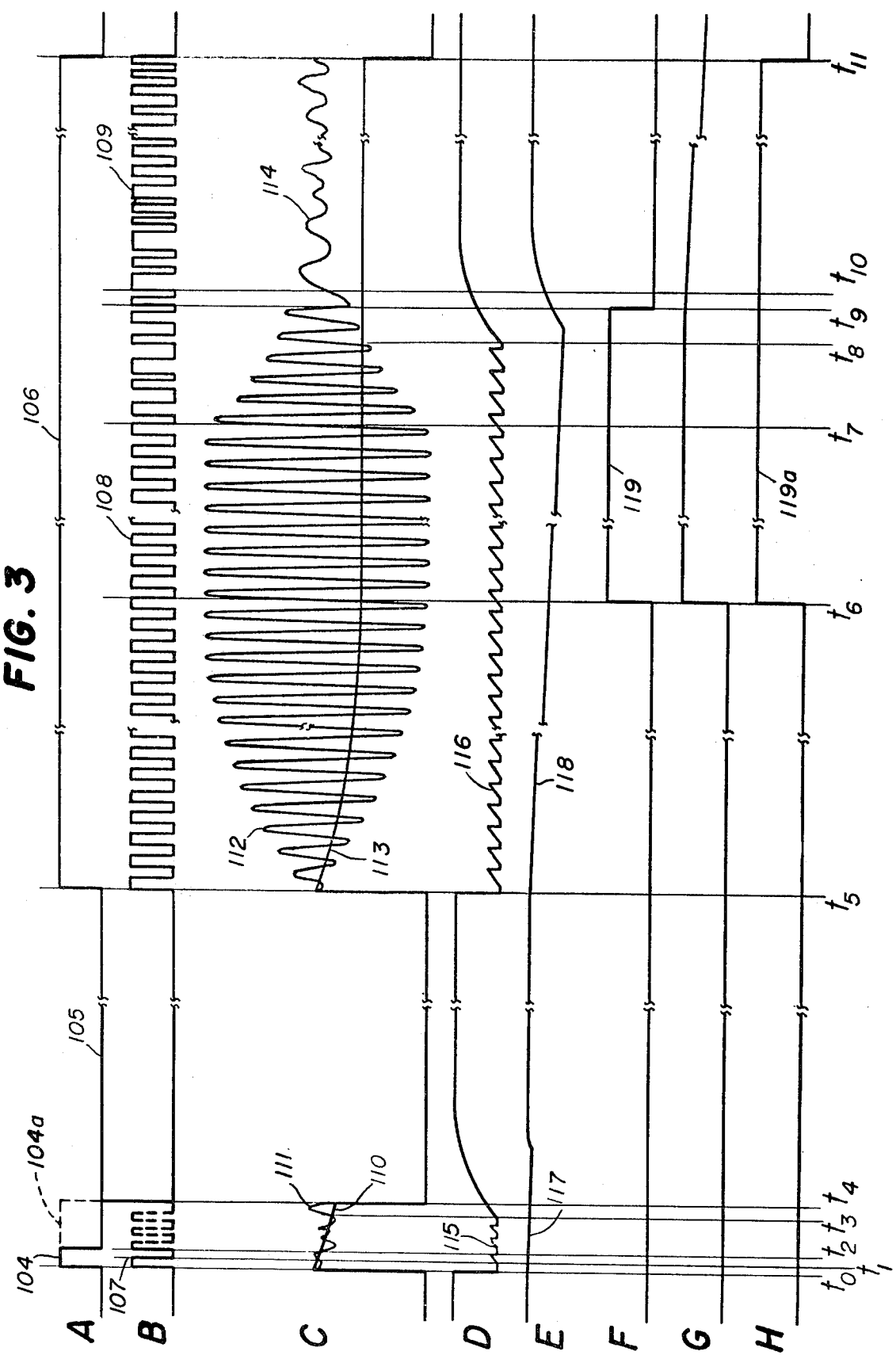
FIG. 3 depicts wave forms at various points in the schematic diagram of FIG. 2.

Turning now to FIG. 3, there is depicted wave forms at points in the receiver of FIG. 2 labeled with capital letters corresponding to the letters on the left-hand side of FIG. 3. FIG. 3A depicts the wave form at the collectors of the transistors 34 and 35 in the battery saver circuit 20. It consists of pulses 104, say 2 ms. in duration, separated by 1.75 second intervals 105. Only one pulse 104 is shown, starting at $t_0$ and ending at $t_2$. As will be described, the pulse duration may be extended, as indicated by 104a, to time $t_4$. During the next pulse, starting at time $t_5$, it is assumed that a proper code tone to which the receiver 10 is designed to respond is received to cause the supply voltage to become continuous, as at 106. The signal from the limiter 13 is represented by the wave form shown in FIG. 3B. Prior to the battery saver pulse 104, that is, prior to time $t_0$, the processor circuit 12 is inoperative and therefore no signal is produced by the limiter 13. At $t_0$, the white noise produced in the processor circuit 12 is reflected as an irregular rectangular wave for the period of the battery saver pulse 104. At $t_5$, it is assumed that a code tone to which the receiver is designed to respond is present when the receiver is again actuated by the pulsed supply voltage. The tone ends at $t_7$. Accordingly, from the period $t_5$ to $t_7$, FIG. 3B depicts a regular rectangular wave 108 having a frequency corresponding to the code tone. Starting at time $t_7$, the limiter 13 provides the ensuing voice message which is represented by an irregular, rectangular wave 109.

FIG. 3C depicts the inputs to the comparator circuit 60. Prior to time $t_0$, the supply voltage BS-B+ is zero and therefore no voltage is supplied by the decay circuit 70 to the threshold input of the comparator circuit 60. Also, no signal is applied to its signal input because the processor circuit 12, etc. are inoperative. At time $t_0$ when the battery saver pulse 104 commences, a threshold voltage is applied to the reference input of the comparator 61, which threshold 110 decays with time. Also, noise is produced by the processor circuit 12 which has components that are coupled through the filter 40 and result in a signal represented by the wave form 111 applied to the signal input of the comparator 61. The threshold 110 and the amplitude of the signal 111 from the filter at time $t_0$ are equal, causing the output of the comparator 61, as shown in FIG. 3D, to become low, to commence a comparator signal 115. The alternating nature of the signal 111 from the filter 40 carries it above and below the threshold 110. When it crosses the threshold 110 in a positive direction, the voltage on the output of the comparator 61 begins to rise, as shown at $t_1$. At time $t_2$, the wave form 111 crosses the threshold 110 causing the output to become low once again. Each time the wave form 111 rises above the threshold 110, the comparator signal begins to increase as represented by the three positive going peaks. Because the peaks of the signal 111 exceed the threshold until time $t_3$, the comparator signal 115 persists for that long and extends the duration of the supply voltage, which is indicated in FIG. 3A by the dashed line 104a, to time $t_4$ when the comparator signal 115 crosses the switching level of the gate 22 (FIG. 2).

The time constant of the resistor 62 and the capacitor 63 in the comparator circuit 60 is important in this regard. Each time the signal 111 exceeds the threshold 110, the capacitor 63 is charged. When the peaks of the signal 111 no longer cross the threshold 110, the capacitor 63 discharges through the resistor 62. The time constant must be such that the capacitor 63 does not discharge to the point that the comparator signal would reach the switching level of the gate 22 during a tone. A tone of 1,000 Hz. would have 1 ms. between negative peaks. The time constant would have to be such as to maintain the charge on the capacitor 63 for at least 1 ms. To accommodate 100 Hz. tones, the time constant would have to be ten times as great; otherwise the capacitor 63 would discharge to the switching point of the gate 22 within the 10 ms. period between negative peaks of the tone. This will cause the battery saver "on" period to exceed 10 ms. in duration. In order to minimize "on" time and, therefore maximize battery life, higher frequency tones should be used. For example, if the tones had frequencies of 500 Hz. or greater, the "on" period would have to be say 3 or 4 ms. (to accommodate 2 ms. between negative peaks plus tolerance.) The capacitor 63 and the resistor 62 operate to extend the "on" period of the multivibrator (determined by the values of the capacitor 26 and the resistor 28 primarily) whenever the time constant of the former pair of components is greater than the time constant of the latter components. Ideally, the "on" period of the multivibrator should be the smaller of the two so that the comparator signal controls the "on" time. This first time constant can thus be varied and made longer for those receivers having lower filter frequencies without any adjustment of the multivibrator.

At time $t_5$, when a code tone of the proper frequency is present, the filter 40 produces a signal 112. The decay circuit 70 produces a decaying threshold 113. Because the frequency of the signal 112 matches the center frequency of the filter 40, its amplitude is substantial and its negative-going peaks continue to exceed the threshold 113. The comparator circuit 60 produces a comparator signal 116, starting at time $t_5$ and decaying slightly every half cycle when the positive peaks of the signal 112 do not exceed the threshold 113. The comparator signal 116 persists because the peaks continue to exceed the threshold 113.

During the initial part of the signal 112 the amplitude of the filter output is building up in the usual way. For the sake of simplicity, the buildup is shown as centered about a constant DC level. In point of fact, the DC level about which the rising portion of the signal 112 is centered, increases at a rate nearly matching the rate of decay of the initial part of the threshold 113.

The comparator signal 116 is coupled to the battery saver circuit 20 and causes the supply voltage 106 to be continuous as long as it exists, as can be seen in FIG. 3A. Therefore, the processor circuit 12 is able to continue to supply signals and the filter 40 continues to supply the signal 112. At $t_7$, the filter output decays, but the comparator signal 116 persists until $t_8$ when the negative peaks no longer exceed the threshold 113, whereupon the capacitor 63 discharges completely. Thus, the comparator signal lasts from about $t_5$ at the beginning of the detection of the tone to about $t_9$. The code tone may have started prior to $t_5$, but it is at that instant when the receiver 10 becomes operative to process a tone.

The comparator signal is applied to the duration sensor 80. From $t_0$ to about $t_4$, the comparator signal 115 charges the capacitor 83 slowly through the resistor 81, to produce a charging voltage 117. Slightly after $t_4$ as the comparator signal 117 ends, the capacitor 83 is rapidly discharged through the diode 82. The amplitude of the signal on the capacitor 83 is not sufficient to have any effect on subsequent circuitry. However, the comparator signal 116 extends for a substantial length of time and therefore the capacitor 83 is completely charged, as shown by the charging voltage in FIG. 3E. As previously explained, the electronic switch 84 will switch conditions when its input decreases to $B+/2$. At time $t_6$, the voltage across the capacitor 83 reaches that value and the electronic switch 84 switches, whereupon its output becomes high as shown in FIG. 3F, to start an output signal 119. When the comparator signal 116 terminates, the capacitor 83 discharges relatively rapidly through diode 82 and when the voltage again reaches $B+/2$ at $t_9$, the electronic switch 84 is switched to its first condition and its output becomes low. Thus, the duration sensor 80 produces the output signal 119 depicted in FIG. 3F, lasting from $t_6$ to $t_9$. Such output signal is produced only if the duration of the comparator signal exceeds the duration $t_5$ to $t_6$. If the comparator signal is shorter, as in the initial part of FIG. 3D, no output signal is produced. The duration $t_5$ to $t_6$ could be 600 ms. for example.

The output signal 119 is applied to the timer 90 and rapidly charges the capacitor 92 to a high value, at $t_6$ as shown in FIG. 3G. At $t_9$ when the output signal 119 terminates, the capacitor 92 discharges slowly through the resistor 91. The electronic switch 93 has a switching voltage of for example $B+/2$. Thus, as long as the voltage exceeds $B+/2$, its output is low, whereas if the input drops below $B+/2$, its output becomes high. That polarity is effectively inverted by the transistor 94, so that the output of the timer 90 depicted in FIG. 3H is normally low and becomes high at time $t_6$ at the start of the output signal 119 which causes the electronic switch 93 to switch. Although the output signal 119 terminates at $t_9$, the slow discharge of the capacitor 92 applied to the electronic switch 93 is in excess of B+/2 until time $t_{11}$, when the timer signal 119a terminates. The period $t_6$ to $t_{11}$ could be ten seconds (plus the duration of the output signal 119). The timer signal 119a is applied to the audio circuit 14 and automatically keeps it operative to process the ensuing voice message. A timer signal lasting for the same period but inverted appears at the output of the electronic switch 93, which is applied to the battery saver circuit 20 to cause the supply voltage to be continuous for this entire period of time. As shown in FIG. 3A, the supply voltage 106 is continuous from $t_5$ at the start of the comparator signal, to $t_{11}$, at the end of the timer signal 119a. With the end of the timer signal 119a, the battery saver circuit 20 reverts to producing pulses to supply the receiver 10.

The tone must be present for nearly the duration $t_5$–$t_6$ in order for the timer signal 119a to be generated. The timer 90 will produce the timer signal 119a if the comparator signal 116 is present at $t_6$. If the comparator signal 116 is not present at $t_6$, signifying that absence has already been determined, then no timer signal will commence. In fact, the battery voltage pulse will have already ended. In the present invention, the timer signal 119a starts a predetermined time after the commencement of the tone 112. In prior art "presence" detectors, the timer signal commenced when the tone amplitude exceeded a given level for a delay period which could occur shortly after commencement of the tone or a substantial period of time later.

We claim:

1. A signal detector for a signal receiver having means for supplying AC signals, said detector comprising a frequency sensor having an output and first and second inputs, said first input being coupled to the AC signal supplying means, said frequency sensor being operative to produce an output signal on said output in response to an AC signal having a frequency within a variable bandwidth, and a source of initializing voltages independent of the AC signal supplying means and coupled to said second input, said frequency sensor being responsive to the initializing voltages to cause the bandwidth to be relatively wide upon application of each initializing voltage and to decrease thereafter.

2. The signal detector of claim 1, wherein the Q of said frequency sensor is maintained constant.

3. The signal detector of claim 1, wherein said frequency sensor has a further output on which appears a further output signal which persists for the duration that the frequency of the AC signal is within the bandwidth.

4. The signal detector of claim 3, wherein said source is coupled to the further output of said frequency sensor and is responsive to the further output signal to extend an initializing voltage substantially to the end of the further output signal.

5. The signal detector of claim 1, and further comprising timer means coupled to said frequency sensor and being responsive to the output signal to produce a timer signal persisting for a predetermined duration.

6. The signal detector of claim 5, wherein said source is coupled to said timer means and is responsive to the timer signal to extend an initializing voltage substantially to the end of the timer signal.

7. The signal detector of claim 1, wherein the bandwidth changes continuously during application of the initializing voltage.

* * * * *